United States Patent [19]
Agostinelli et al.

[11] Patent Number: 5,118,662
[45] Date of Patent: Jun. 2, 1992

[54] ARTICLE COMPRISING CONDUCTIVE FILM OF CRYSTALLINE BISMUTH MIXED ALKALINE EARTH OXIDE CONTAINING SILVER

[75] Inventors: John A. Agostinelli; Liang-sun Hung, both of Rochester; Jose M. Mir, Webster, all of N.Y.

[73] Assignee: Eastman Kodak Company, Rochester, N.Y.

[21] Appl. No.: 711,778

[22] Filed: Jul. 17, 1991

Related U.S. Application Data

[62] Division of Ser. No. 347,607, May 4, 1989, Pat. No. 5,082,688.

[51] Int. Cl.$^5$ .............. C22C 29/12; H01L 39/24; H01L 39/12; C04B 35/00
[52] U.S. Cl. .............................. 505/1; 428/930; 428/697; 428/688; 505/781; 505/782
[58] Field of Search ............... 505/1, 781, 782, 784, 505/785; 428/328, 688, 697, 700, 930

[56] References Cited

U.S. PATENT DOCUMENTS 4,826,808 5/1989 Yurek et al. ............... 505/1

FOREIGN PATENT DOCUMENTS 9100622 1/1991 World Int. Prop. O. .......... 505/1

OTHER PUBLICATIONS

Sherwood et al., "Superconducting Properties of YBa$_2$Cu$_3$O$_7$ Doped with Various Metals and Oxides", *Mat. Res. Soc. Symp. Proc.* vol. 99, pp. 503–506 (1988).
Kovachev et al., "Superconductivity in Y–Ba–Cu–Ag–O and Y–Ba–Cu–Pt–O Systems", *Mat. Res. Soc. Symp. Proc.* vol. 99, pp. 659–662 (1988).
Hashimoto et al., "Superconductivity and Substrate Interaction of Screen-Printed Bi–Sr–Ca–Cu–O Films", *Jap. J. Appl. Phys.* vol. 27, pp. L384–L386 (1988).
Nakao et al., "Magnetron Sputtering of Bi–Ca–Sr–Cu–O Thin Films with Superconductivity above 80 K", *Jap. J. Appl. Phys.* vol. 27, pp. L378–L380.

*Primary Examiner*—Ellis P. Robinson
*Assistant Examiner*—Frank Rosenberg
*Attorney, Agent, or Firm*—J. Jeffrey Hawley; Carl O. Thomas; Bernard D. Wiese

[57] ABSTRACT

A conductive film of crystalline bismuth mixed alkaline earth oxide containing silver is disclosed. A process for promoting the growth of crystalline bismuth mixed alkaline earth oxide grains by incorporating silver prior to sintering is also disclosed.

8 Claims, No Drawings

ARTICLE COMPRISING CONDUCTIVE FILM OF CRYSTALLINE BISMUTH MIXED ALKALINE EARTH OXIDE CONTAINING SILVER

This is a divisional of application Ser. No. 347,607, filed on May 4, 1989 now U.S. Pat. No. 5,082,688.

FIELD OF THE INVENTION

The invention relates to conductive articles and processes for their formation. Specifically, the invention relates to a process of forming a conductive crystalline bismuth mixed alkaline earth copper oxide film on a substrate and to the conductive article produced.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity begins to decrease (conductivity begins to increase) markedly as a function of further decrease in temperature. This is referred to as the superconducting onset transition temperature or, in the context of superconductivity investigations, simply as the onset critical temperature ($T_c$). $T_c$ provides a conveniently identified and generally accepted reference point for marking the onset of superconductivity and providing temperature rankings of superconductivity in differing materials. The highest temperature at which superconductivity (i.e., zero resistance) can be measured in a material is referred to as the onset superconductivity temperature ($T_o$).

H. Maeda, Y. Tanaka, M. Fukutomi, and Y. Asano, "A New High $T_c$ Superconductor Without a Rare Earth Element", Japanese Journal of Applied Physics, Vol. 27, No. 2, pp. L209 & L210, first reported that at least one compound of bismuth, strontium, calcium, copper, and oxygen had been found to be superconducting.

One of the difficulties that has arisen in attempting to form films of bismuth mixed alkaline earth copper oxides that are superconducting is that high sintering temperatures are required to form the crystalline grains of bismuth mixed alkaline earth copper oxide responsible for superconductivity. It is the necessity of sintering at high temperatures that has set the formation of superconducting films in a class apart from the preparation of bulk superconducting materials. In conductive film fabrication substrate interaction with the film during sintering must be taken into account. The greater the thermal driving force (a function of the time and temperature of sintering) required to form the crystalline grains of the film, the greater is the risk of degradation due to unwanted interaction between the conductive film and substrate.

S. Jin et al, Appl. Phys. Lett. 52(19), 9 May 1988, pp. 1628-1630, reports the incorporation of silver in bismuth strontium calcium copper oxides.

RELATED PATENT APPLICATIONS

Agostinelli, Paz-Pujalt, Mehrotra, and Hung U.S. Ser. No. 172,926, filed Mar. 25, 1988, now abandoned in favor of U.S. Ser. No. 214,976, filed Jul. 5, 1988, now abandoned in favor of U.S. Ser. No. 359,306, filed May 31, 1989, now U.S. Pat. No. 4,950,643 commonly assigned, discloses the successful formation of superconductive films using bismuth mixed alkaline earth copper oxides. The partial substitution of barium for strontium and the partial substitution of antimony for bismuth are disclosed.

Strom U.S. Ser. No. 291,921, filed Dec. 29, 1988, titled SUPERCONDUCTING THICK FILMS FOR HYBRID CIRCUITRY APPLICATIONS, now abandoned in favor of U.S. Ser. No. 556,520, filed Jul. 20, 1990, commonly assigned, discloses the successful formation of BSCCO-2212 superconducting thick films. The partial substitution of barium for strontium and the partial substitution of lead and/or antimony for bismuth are disclosed.

Mir et al U.S. Ser. No. 308,297, filed Feb. 9, 1989, now U.S. Pat. No. 4,988,674, commonly assigned, titled ELECTRICALLY CONDUCTIVE ARTICLES AND PROCESSES FOR THEIR FABRICATION, discloses the formation of a flexible superconductive film by providing a release layer comprised of gold and/or silver on a substrate, forming a conductive cuprate layer on the substrate, bonding a flexible organic film to the conductive cuprate layer, and stripping the conductive cuprate layer and organic film from the substrate.

Lelental and Romanofsky U.S. Ser. No. 347,604, concurrently filed and commonly assigned, titled PROCESSES OF FORMING CONDUCTIVE FILMS AND ARTICLES SO PRODUCED, now abandoned in favor of U.S. Ser. No. 546,458, filed Jun. 29, 1990, discloses the formation of bismuth mixed alkaline earth copper oxide conductive films in the presence of a stoichiometric excess of bismuth or bismuth in combination with lead.

Agostinelli, Hung, Lelental, and Romanofsky U.S. Ser. No. 347,600, concurrently filed and commonly assigned, titled PROCESSES OF FORMING CONDUCTIVE FILMS AND ARTICLES SO PRODUCED now abandoned, discloses the formation of bismuth mixed alkaline earth copper oxide conductive films in the presence of lead.

SUMMARY OF THE INVENTION

In one aspect this invention is directed to a process of forming on a substrate a conductive film containing grains of crystalline bismuth mixed alkaline earth copper oxide comprising locating a bismuth mixed alkaline earth copper oxide on the substrate and sintering at least a portion of the mixed alkaline earth copper oxide to form a conductive crystalline grain structure. The process is characterized in that silver is incorporated in the bismuth mixed alkaline earth copper oxide as a grain growth promoting agent prior to sintering.

In another aspect the invention is directed to an article comprised of a substrate bearing a conductive film containing grains of crystalline bismuth mixed alkaline earth copper oxide. The article is characterized in that silver is present in the bismuth mixed alkaline earth copper oxide.

DESCRIPTION OF PREFERRED EMBODIMENTS

Except as otherwise noted, the term "conductive" is used to mean electrically conductive and all ratios and percentages throughout this disclosure are on an atomic basis.

The invention relates to a compositionally altered preparation of a bismuth mixed alkaline earth copper oxide film on a substrate and to articles produced by the process. It has been discovered that silver acts as a grain growth promoting agent during the sintering step of forming a conductive bismuth mixed alkaline earth copper oxide film.

As demonstrated in the Examples below, providing silver in bismuth mixed alkaline earth copper oxide prior to sintering results in the formation of larger crystalline grain sizes for a given sintering time and temperature. Thus, the presence of silver in the mixed oxide acts as a grain growth promoting agent. The silver can be used to either produce larger crystalline grain sizes in the conductive film employing a given sintering time and temperature or to decrease the sintering time and/or temperature required to produce crystalline grains of a selected size range.

At silver concentrations of from 1 to 20 percent, based on copper, the presence of silver allows advantages to be realized in any one or a combination of four different ways:

(a) Larger crystalline grain sizes can be produced as compared to those produced in a comparable film lacking silver;

(b) The same crystalline grain sizes can be produced in films containing and lacking silver, where the film containing silver is sintered for a shorter time period;

(c) The same crystalline grain sizes can be produced in films containing and lacking silver, where the film containing silver is sintered at a lower temperature; and (d) Higher onset transition temperatures and superconductivity can be achieved than in the absence of silver.

Silver concentrations can be varied over the range of from 1 to 20 percent, preferably 5 to 10 percent, based on copper. The full advantage of the silver grain growth promoting agent is generally achieved at concentrations of 10 percent or less, based on copper. The silver is believed to be present in the conductive film in its zero valent (metallic) form. Concentrations of silver of up to 20 percent, based on copper, assure adequate silver for grain growth promotion while limiting the formation of a separate silver phase.

In one form of the invention the bismuth mixed alkaline earth copper oxide is conventionally formulated for sintering, except that silver is added in the proportions indicated. The silver can be added in any convenient finely divided metallic form. Alternatively, the silver can be added as an oxide or as any other convenient silver precursor. When added as a precursor the same heating step prior to sintering converts the silver precursor to silver and also converts other metal oxide precursors to metal oxides. However, unlike the other metals, which are converted from metal oxide precursors to metal oxides, silver precursors are converted to metallic silver during heating.

The mixed alkaline earth oxides can be selected and employed in any convenient proportion in relation to copper conventionally employed in forming bismuth mixed alkaline earth copper oxide crystalline conductive films. Typically the mixed alkaline earth oxides are mixtures of strontium and calcium oxides, although from 0 to 10 percent barium, based on barium and strontium combined, can be substituted for strontium. Strontium is to a degree interchangeable with calcium in the higher onset transition crystalline phase. More than half of either strontium or calcium can readily be replaced by the other.

It is recognized that lead can be added as an oxide or oxide precursor to the metal oxide mixture present before sintering. Lead can take the place of up to 50 percent (preferably up to 40 percent) of the bismuth. Lelental and Romanofsky formation of bismuth mixed alkaline earth copper oxide conductive films in the presence of a stoichiometric cited above discloses the excess of bismuth or bismuth in combination with lead. Agostinelli, Hung, Lelental, and Romanofsky, discloses the formation of bismuth mixed alkaline earth copper oxide conductive films in the presence of lead. Lead acts as a grain growth promoter and produces optimum conductive films at somewhat lower temperatures (>885° C.) than bismuth alone.

Since lead is an optional ingredient, its minimum concentration can be zero; however, when the advantages of lead incorporation are sought, it is preferred that lead be present in a minimum concentration of at least 1 percent (preferably at least 5 percent) based on bismuth and lead combined. As employed herein references to bismuth mixed alkaline earth copper oxides are to be understood to include lead in the useful proportions indicated above, unless otherwise indicated.

The proportions in which the various metal oxides or oxide precursors are brought together prior to sintering is dictated by the crystalline phases sought to be formed. It is known that bismuth strontium calcium copper oxides are capable of forming at least two clearly distinguishable superconductive phases. A superconducting phase having the lower onset transition temperature ($T_c = 85°$ K.) is also identified by a crystal cell 30.7Å c axis and is generally accepted to satisfy the theoretical stoichiometry $Bi_2Sr_2CaCu_2O_8$ (hereinafter also referred to as BSCCO-2212). A superconducting phase having a higher onset transition temperature ($T_c$ at least 110° K.) is also identified by a crystal cell 37Å c axis and is generally accepted to satisfy the theoretical stoichiometry $Bi_2Sr_2Ca_2Cu_3O_{10}$ (hereinafter also referred to as BSCCO-2223). The simplest approach to forming metal oxide mixtures satisfying the requirements of the invention is to provide the metal oxides or oxide precursors in the metal ratios conforming to the ideal stoichiometry of the higher or lower onset transition phases (or any desired mixture of these phases) or within a plus or minus variance for any individual metal (taking copper as a reference) of no more than 20 percent, preferably no more than 10 percent, taking the known interchangeabilities of the alkaline earth metals into account.

For example, in seeking to prepare a superconductive film according to the invention approximating the properties of BSCCO-2212, a very simple mixture of metal oxides or oxide precursors, where silver can be as an oxide, oxide precursor, or metal, can satisfy the following metal relationship:

$$Bi_2Sr_2Ca(CuAg_x)_2 \qquad (I)$$

where
x 0.01 to 0.2 (preferably 0.05 to 0.1).

Taking into account the variances discussed above, it is appreciated that a more general range of proportions can satisfy the following metal relationship:

$$M_aIIA_b(CuAg_x)_2 \qquad (II)$$

where

M is bismuth and from 0 to 50 percent (preferably 0 to 40 percent) lead, based on bismuth and lead, and a is from 1.6 (preferably 1.8 and optimally >2.0) to 6 (preferably 4);

IIA is a combination of the alkaline earth elements A and Ca in a ratio of 2.5:0.5 to 1.0:1.5;

A is strontium and from 0 to 10 percent barium, based on strontium and barium;

b is from 2.4 to 3.6 (preferably 2.7 to 3.3); and x is from 0.01 to 0.2 (preferably 0.05 to 0.1).

In seeking to prepare a superconductive film according to the invention approximating the properties of BSCCO-2223, a very simple proportion of metal components can satisfy the following metal relationship:

$$Bi_2Sr_2Ca_2(CuAg_x)_3 \qquad (III)$$

where x is as previously defined. Taking into account the variances discussed above, it is appreciated that a more general range of workable proportions can satisfy the following metal relationship:

$$M_aIIA_b(CuAg_x)_3 \qquad (IV)$$

where

M is as previously defined;

a is from 1.6 (preferably 2.0 and optimally >3.0) to 9 (preferably 6);

IIA is a combination of the alkaline earth elements A and Ca in a ratio of 3:1 to 1:3;

A is strontium and from 0 to 10 percent barium, based on strontium and barium;

b is 3.2 (preferably 3.6) to 4.8 (preferably 4.4); and x is as previously defined.

Even larger stoichiometric excesses of bismuth and alkaline earth metals can be employed. Because of their low cost larger excesses of the alkaline earth metals are not objectionable, except to the extent that separate phases tend to reduce the proportion of the more desirable conductive phase or phases. Stoichiometric excesses of bismuth are to some extent volatilized during sintering. It is therefore apparent that relationships III and IV can be combined into a general relationship V below, particularly in forming mixed crystalline conductive phases:

$$M_aIIA_b(CuAg_x)_c \qquad (V)$$

where

M, IIA, and x are as previously defined;

a is from 1.6 to 9;

b is from 2.4 to 4.8; and c is from 2 to 3.

Any conventional technique heretofore taught for forming a mixture of bismuth, alkaline earth, and copper oxides on a substrate for crystallization can be employed to form silver doped bismuth mixed alkaline earth copper oxide (hereinafter also referred to as M-IIA-C-O-Ag) layers of this invention. For example, the metal oxide deposition procedure of Yoshitake, T. Satoh, Y. Kubo, and H. Igarashi, "Preparation of Thin Films by Coevaporation and Phase Identification in Bi-Sr-Ca-Cu-O System", *Japanese Journal of Applied Physics*, Vol. 27, No. 6, Jun. 1988, pp L1089–L1091, cited above and here incorporated by reference, can be employed.

The present invention is fully applicable to the techniques of forming thick (>5 μm) film M-IIA-C-O superconductive articles disclosed by Strom cited above. Only the compositional adjustments discussed above are required to employ the Strom procedures.

Preferred procedures for preparing Ag doped M-IIA-C-O layers is similar to that set out in Mir et al European Patent Application 0 290 357, published Nov. 9, 1988, here incorporated by reference, except that Ag doped M-IIA-C-O is substituted for rare earth alkaline earth copper oxide (therein also referred to as RAC) and firing and cooling conditions are modified as described below.

These preferred procedures for forming Ag doped M-IIA-C-O layers are similar, except for the compositional improvements noted above, to the procedures described in Agostinelli et al U.S. Pat. No. 4,950,643, cited above, for forming heavy pnictide mixed alkaline earth cooper oxide (therein also referred to as PAC) layers. To form a precursor layer onto a selected substrate is coated a solution consisting essentially of a volatilizable film forming solvent and metal-ligand compounds of each of the metals M, IIA, and Cu containing at least one thermally decomposable ligand. Ag is preferably also incorporated via a metal-ligand compound, the same ligands known to be useful with the other metals also being useful with silver. The solvent and ligands are removed from the substrate by heating in the presence of oxygen to form an initial mixture of the metals in the form of an oxide or an oxide intermediate (e.g., a carbonate). However, normally the silver-ligand compound is converted directly to silver metal on heating. Heating to a high temperature is then undertaken to complete conversion of any intermediates to oxides and to convert the resulting Ag doped M-IIA-C-O layer to the desired conductive crystalline form.

The first step toward conductive article formation is, of course, substrate selection. Preferred substrates are those inert toward or at least minimally interactive with the M-IIA-C-O layer. It is generally preferred to select substrates from among materials which exhibit the same or a similar crystalline form, such as a perovskite crystalline form. Lanthanum gallate (LaGaO$_3$), lanthanum aluminate (LaAl$_3$), and potassium tantalate (KTaO$_3$) are examples of perovskite crystalline substrates. Alkaline earth oxides and zirconia constitute particularly preferred classes of substrates. They are in general relatively inert, refractory materials which exhibit limited interaction with the M-IIA-C-O layers during their formation. Magnesium oxide and strontium titanate (a perovskite) are examples of readily available alkaline earth oxide substrate materials. As employed herein the term "alkaline earth oxide substrate" is employed to indicate substrates that are comprised of alkaline earth oxides. The lower firing temperatures made possible by the inclusion of lead also make the use of polycrystalline and monocrystalline alumina attractive.

It is recognized that the selection of substrates can be broadened by employing barrier layers and/or repeating the film forming sequence so that earlier formed layers in effect serve as a substrate for later formed M-IIA-C-O layers. Both of these variations are taught by Mir et al EP 0 290 357, cited above. Other barrier layer arrangements, such as those disclosed by Agostinelli et al U.S. Ser. No. 85,047, now abandoned filed Aug. 13, 1987, and Hung et al U.S. Ser. No. 153,699, filed Feb. 3, 1988, both commonly assigned, are also specifically contemplated. For example, in employing silicon as a substrate it is specifically contemplated to employ zirconia, alkaline earth oxides such as magnesia, and noble metals such as gold as barrier layer materials. A preferred combination is provided by a silicon substrate and a triad of barrier layers, the barrier layer nearest the silicon support being silica, the barrier layer farthest from the silicon support being a Group 4 metal oxide (preferably zirconia), and the interposed barrier layer being a mixture of silica and zirconia.

To form the precursor layer a solution of a film forming solvent, a bismuth compound, optionally a silver compound, at least two alkaline earth metal compounds, and a copper compound is prepared. Each of the compounds consists of metal ion and one or more volatilizable ligands. Most useful metal-ligand compounds (e.g., metalorganic compounds) thermally decompose to form metal oxides. Some metal compounds, in particular some alkaline earth organic compounds, can form metal carbonates on decomposition, which can then be converted to oxides during heating to crystallization temperatures. A ligand oxygen atom bonded directly to a metal other than silver is often retained with the metal in the Ag doped M-IIA-C-O layer, although other ligand oxygen atoms are generally removed. Typically the ligands and their component atoms other than oxygen are outgassed at temperatures of less than 600° C. On the other hand, to avoid loss of materials before or during initial coating of the metal-ligand compounds, it is preferred that the ligands exhibit limited, if any, volatility at ambient temperatures. Metal-ligand compounds having any significant volatility below their decomposition temperature are preferably avoided.

Metalorganic (including metallo-organic and organometallic) compounds, such as metal alkyls, alkoxides, $\beta$-diketone derivatives, and metal salts of organic acids--e.g., carboxylic acids, constitute preferred metal-ligand compounds for preparing PAC precursor coatings. The number of carbon atoms in the organic ligand can vary over a wide range, but is typically limited to less than 30 carbon atoms to avoid unnecessarily reducing the proportion of metal ions present. Carboxylate ligands are particularly advantageous in promoting metal-ligand solubility. While very simple organic ligands, such as oxalate and acetate ligands, can be employed in one or more metal-ligands compounds, depending upon the film forming solvent and other metal-ligand compound choices, it is generally preferred to choose organic ligands containing at least 4 carbon atoms. The reason for this is to avoid crystallization of the metal-ligand compound and to improve solubility. When heating is begun to remove the film forming solvent and ligands, the solvent usually readily evaporates at temperatures well below those required to remove the ligands. This results in leaving the metal-ligand compounds on the substrate surface. When the ligands have few carbon atoms or, in some instances, linear carbon atom chains, crystallization of the metal-ligand compounds occurs. In extreme cases crystallization is observed at room temperatures. This works against the molecular level uniformity of heavy pnictide, alkaline earth, and copper sought by solution coating. Choosing organic ligands exhibiting 4 or more carbon atoms, preferably at least 6 carbon atoms, and, preferably, ligands containing branched carbon atom chains, reduces molecular spatial symmetries sufficiently to avoid crystallization. Optimally organic ligands contain from about 6 to 20 carbon atoms.

Instead of increasing the molecular bulk or modifying the chain configuration of organic ligands to avoid any propensity toward metalorganic compound crystallization on solvent removal, another technique which can be employed is to incorporate in the film forming solvent a separate compound to act as a film promoting agent, such as a higher molecular weight branched chain organic compound. This can, for example, take the form of a branched chain hydrocarbon or substituted hydrocarbon, such as a terpene having from about 10 to 30 carbon atoms.

The film forming solvents can be chosen from a wide range of volatilizable liquids. The primary function of the solvent is to provide a liquid phase permitting molecular level intermixing of the metalorganic compounds chosen. The liquid is also chosen for its ability to cover the substrate uniformly. Thus, an optimum film forming solvent selection is in part determined by the substrate chosen. Generally more desirable film forming properties are observed with more viscous solvents and those which more readily wet the substrate alone, or with an incorporated wetting agent, such as a surfactant, present.

It is appreciated that a wide variety of ligands, film promoting agents, and film forming solvents are available and can be collectively present in a virtually limitless array of composition choices.

Exemplary preferred organic ligands for metal organic compounds include metal 2-ethylhexanoates, naphthenates, neodecanoates, butoxides, isopropoxides, rosinates (e.g., abietates), cyclohexanebutyrates, and acetylacetonates, where the metal can be any of Ag, M, IIA, or Cu to be incorporated in the Ag doped M-IIA-Cu-O layer. Exemplary preferred film forming agents include 2-ethylhexanoic acid, rosin (e.g., abietic acid), ethyl lactate, 2-ethoxyethyl acetate, and pinene. Exemplary preferred film forming solvents include toluene, 2-ethylhexanoic acid, n-butyl acetate, ethyl lactate, propanol, pinene, and mineral spirits.

As previously noted, the metal-ligand compounds are incorporated in the film forming solvent in the proportion desired in the final crystalline Ag doped M-IIA-C-O layer. The bismuth, lead, alkaline earth, copper, and silver can each be reacted with the same ligand forming compound or with different ligand forming compounds. The metal-ligand compounds can be incorporated in the film forming solvent in any convenient concentration up to their saturation limit at ambient temperature. Generally a concentration is chosen which provides the desired crystalline Ag doped M-IIA-Cu-O layer thickness for the process sequence. Where the geometry of the substrate permits, uniformity and thickness of the metal-ligand coating can be controlled by spinning the substrate after coating around an axis normal to the surface of the substrate which has been coated. A significant advantage of spin coating is that the thickness of the coating at the conclusion of spinning is determined by the contact angle and viscosity of the coating composition and the rate and time of spinning, all of which can be precisely controlled. Differences in the amount of the coating composition applied to the substrate are not reflected in the thickness of the final coating. Centrifugal forces generated by spinning cause excess material to be rejected peripherally from the article.

It is preferred to employ firing temperatures ranging from 800° C. (optimally at least 825° C.) to 910° C. (optimally 885° C. or less). Sintering temperatures must be high enough to produce the crystalline conductive phase or phases being sought. At the same time sintering temperatures must be maintained below temperatures at which the metals separate into different phases. Generally Ag doped M-IIA-C-O conductive films can be formed by sintering in the same time and temperature ranges conventionally employed in the absence of silver.

The duration of sintering can be very short, where the object is to form the lower onset transition ($T_c = 85°$ K.) phase. Sintering times as short as 1 minute (preferably 5 minutes) are effective forming this phase. When the lower onset transition phase is being formed, there is no advantage to extending sintering times beyond about 20 minutes. However, when the higher onset transition phase ($T_c$ at least 110° K.) is being formed, extended sintering times are contemplated. For maximum conversion to the higher onset transition phase sintering times times range from 2 to 200 hours (optimally from 6 to 100 hours). If mixed phases are acceptable any sintering time from 1 minute to 200 hours can be employed.

Ag doped M-IIA-C-O layer crystallization can be undertaken in any convenient oxidizing atmosphere, including oxygen or oxygen contained in a convenient carrier, such as argon or air. The crystalline Ag doped M-IIA-C-O layers show little response to variances in cooling and/or annealing following crystal formation.

EXAMPLES

The invention can be better appreciated by reference to the following specific embodiments of the invention:

Precursors

The following individual metallo-organic precursors, prepared as described, were employed:

Bi-P1. Bismuth 2-ethylhexanoate 20.0g Excess $Bi_2O_3$
25.0g 2-Ethylhexanoic acid Mix the solid bismuth oxide with 2-ethylhexanoic acid and heat to approximately 120° C. Add a few drops of ammonium hydroxide (30% $NH_3/H_2O$) in order to speed up the reaction. After refluxing for 4 hours, filter, dry with sieves, and concentrate the liquid phase. Analysis showed 17.7% Bi by weight.

Ca-P1. Calcium 2-ethylhexanoate

Calcium carbonate was treated with excess of 2-ethylhexanoic acid and xylene as needed at 120° C. for 18 hours. The mixture was then filtered and dried with molecular sieves. This was followed by concentration and filtration of the solution. Analysis showed a residue of 4.58% CaO (3.27% Ca) by weight.

Sr-P1. Strontium cyclohexanebutyrate

This compound is available commercially in high quality from Eastman Chemicals. It is supplied with an assay indicating a strontium concentration of 19.4% by weight for the lot which was used.

Cu-P1. Copper 2-ethylhexanoate

The Cu precursor was prepared by reacting copper acetate with 2-ethylhexanoic acid as follows:

React copper acetate (available from Baker, as 1766-1, 31.8% Cu by weight) with 2-ethylhexanoic acid by mixing 2.0g Cu Acetate into 8.0g 2-ethylhexanoic acid, and heating to the boiling point for 5 minutes in an open vessel. Add back enough 2-ethylhexanoic acid to cancel the weight lost during reaction to return to 10.0g total solution. At this point a stable Cu precursor solution having 6.36% Cu by weight is produced.

BSCC-P1. $Bi_2SR_2CaCu_2O_{8+x}$ Precursor

A precursor solution for $Bi_2Sr_2CaCu_2O_{8+x}$ was prepared as described below:

2.0g of Bi-P1 was mixed with 1.43g of Ca-P1 and 2.32g of Cu-P1. These three solutions were miscible and formed a stable solution. To this were added 1.05g Sr-P1 followed by heating at the boiling point to get all of the powder into solution. Some reaction had also likely occurred during this step (exchanges of carboxylate ligands). The result was a stable blue solution. To this solution was added 0.5g rosin (available from Eastman Chemicals as Rosin 2315) followed by gentle heating to get all of the rosin in solution. The solution was filtered to remove any particulate contaminants. The result was a stable solution having excellent rheological properties.

Ag-P1. Silver 2-Ethylhexanoate

A commercial silver 2-ethylhexanoate (source: Strem) was combined with solvents as follows: To 0.5 g Ag 2-ethylhexanoate was mixed 4.7 g cineole and 1.6 g toluene. The mixture was heated until no solid remained. The solution contained a calculated silver concentration of 3.5 percent by weight, based on total weight.

Coating Comparisons

Precursors Ag-P1 and BSCC-1 were combined in various proportions to produce a variety of coatings differing in the percentage of silver. The precursors were spin coated onto the {100} surface of monocrystalline magnesia substrates at 5000 rpm for 20 seconds. The coated substrates were heated to 550° C. on a hot plate. The coated substrate samples were sintered to form the crystalline grains responsible for superconductivity. Sintering was conducted in a furnace at 855° C. for 5 minutes in air, with the samples being rapidly cooled. The final film thickness was about 1.5 μm.

Control 1

In this coating only BSCC-P1 was employed--i.e., no Ag was introduced into the film. The processed film had a room temperature sheet resistance of approximately 25 ohm/square and low temperature four point resistance measurement revealed an onset transition temperature ($T_c$) above 100° K. with superconductivity (zero resistance) being attained 75°–78° K. The film was polycrystalline with grain sizes being in the range of about 1 μm. X-ray diffraction analysis showed a highly c-axis oriented BSCCO-2212 crystal structure.

EXAMPLE 2

In this coating 5 percent silver, based on copper, was present. The film was polycrystalline with grain sizes being in the range of about 3 to 6 μm. This was significantly greater than the corresponding value of the undoped superconducting film. X-ray diffraction analysis indicated the presence of the oriented superconducting oxide phase. The resistivity retained a clearly metallic behavior down to the superconducting temperature ($T_o$) at 82° K.

EXAMPLE 3

In this coating 10 percent silver, based on copper, was present. The film was polycrystalline with grain sizes being in the range of about 4 to 8 μm. X-ray diffraction analysis confirmed the formation of the preferentially oriented orthorhombic superconducting phase. Peaks corresponding to pure silver were also seen. The oxide film shows a sharp transition to superconductivity with a midpoint transition temperature of 90° K. and zero resistivity ($T_o$) at 85° K.

The advantages of silver doping were still observed when the proportion of silver was increased, but no further improvement in performance was observed.

The invention has been described in detail with particular reference to preferred embodiments thereof, but it will be understood that variations and modifications can be effected within the spirit and scope of the invention.

What is claimed is:

1. An article comprised of a substrate bearing a conductive film containing grains of crystalline bismuth mixed alkaline earth copper oxide, characterized in that silver is present in the conductive film in a concentration of 1 to 20 percent, based on copper, the surface of the substrate bearing the film is substantially inert toward the film and is a crystalline perovskite, alkaline earth oxide, noble metal, zirconia or alumina, and the metal components of the oxide satisfy at least one of the following metal relationships;

$$M_a IIA_b (CuAg_x)_2 \quad (I)$$

where
M is bismuth and from 0 to 50 percent lead, based on bismuth and lead,
a is from 1.6 to 6,
IIA is a combination of the alkaline earth elements A and Ca in a ratio of 2.5:0.5 to 1.0:1.5,
A is strontium and from 0 to 10 percent barium, based on strontium and barium,
b is from 2.4 to 3.6, and
x is from 0.01 to 0.2, or $$M_a IIA_b (CuAg_x)_3 \quad (II)$$

where
M is bismuth and from 0 to 50 percent lead, based on bismuth and lead,
a is from 1.6 to 9,
IIA is a combination of the alkaline earth elements A and Ca in a ratio of 3:1 to 1:3,
a is strontium and from 0 to 10 percent barium, based on strontium and barium,
b is 3.2 to 4.8, and
x is from 0.01 to 0.2.

2. An article according to claim 1 further characterized in that silver is present in the conductive film in a concentration of from 5 to 10 percent, based on copper.

3. An article according to claim 1 further characterized in that the alkaline earth elements consist essentially of strontium and calcium.

4. An article according to claim 1 further characterized in that the substrate is an alkaline earth oxide substrate.

5. An article according to claim 4 further characterized in that the substrate is monocrystalline magnesia and the conductive film is located on a {100} crystal face of magnesia substrate.

6. An article according to claim 1 further characterized in that the substrate is alumina.

7. An article according to claim 1 further characterized in that the substrate is monocrystalline alumina.

8. An article according to claim 1 further characterized in that the substrate is comprised of zirconia.

* * * * *